United States Patent [19]

Neilson

[11] 3,831,187

[45] Aug. 20, 1974

[54] THYRISTOR HAVING CAPACITIVELY COUPLED CONTROL ELECTRODE

[75] Inventor: John Manning Savidge Neilson, Somerville, N.J.

[73] Assignee: RCA Corporation, New York, N.Y.

[22] Filed: Apr. 11, 1973

[21] Appl. No.: 350,110

[52] U.S. Cl. .................................... 357/38, 357/23

[51] Int. Cl. .......................... H01l 11/10, H01l 5/06

[58] Field of Search ................... 317/235 AB, 235 B

[56] References Cited

UNITED STATES PATENTS

| | | | |
|---|---|---|---|
| 3,206,670 | 9/1965 | Atalla | 317/235 B |
| 3,264,493 | 8/1966 | Price | 317/235 B |
| 3,401,319 | 9/1968 | Watkins | 317/235 B |
| 3,432,731 | 3/1969 | Whittier | 317/235 AB |
| 3,437,891 | 4/1969 | Yamashita | 317/235 B |
| 3,667,115 | 6/1972 | Barson et al. | 317/235 B |
| 3,719,864 | 3/1973 | Taniguchi et al. | 317/235 B |
| 3,742,318 | 6/1973 | Yamashita | 317/235 AB |

FOREIGN PATENTS OR APPLICATIONS

| | | | |
|---|---|---|---|
| 1,094,336 | 12/1967 | Great Britain | 317/235 AB |

*Primary Examiner*—Rudolph V. Rolinec
*Assistant Examiner*—William D. Larkins

[57] ABSTRACT

A control electrode overlies one of the base regions of the thyristor, a dielectric layer being disposed therebetween. To minimize the potential stress applied across the dielectric layer, the control electrode overlies less than the entire width of the depletion layer associated with the thyristor forward direction, voltage blocking PN junction.

4 Claims, 7 Drawing Figures

THYRISTOR HAVING CAPACITIVELY COUPLED CONTROL ELECTRODE

This invention relates to thyristor type semiconductor devices, and particularly to such devices having a triggering or control electrode capacitively coupled to a base region thereof.

Conventional thyristor devices, such as silicon controlled rectifiers and triacs, contain at least one gate electrode ohmically connected to a base region of the device whereby, upon the application of a suitable voltage to the gate electrode, and injection of charge carriers into the base region, the device is triggered into a state of conduction.

A variation of such devices employs a control electrode capacitively coupled to a base region of the device through a dielectric layer disposed therebetween. Upon the application of a suitable voltage to the control electrode, the conductivity of a portion of the base layer adjacent to the dielectric layer is reversed, thereby providing an ohmic path through the otherwise voltage blocking base layer and allowing breakdown of the device, i.e., triggering of the device from a voltage-blocking to a current-conducting state.

A limitation on such prior art capacitively coupled devices is that, as described hereinafter, the voltage applied to the anode of the device during the voltage blocking mode of operation of the device appears across the dielectric layer, whereby the device is limited in its use to anode voltages no greater than that which would cause breakdown of the dielectric layer and triggering of the device into conduction. It is desirable to increase the voltage blocking capability of such devices without increasing the thickness of the dielectric layer, which increased thickness would undesirably reduce the sensitivity of the device.

DETAILED DESCRIPTION OF THE INVENTION

Figures 1, 2:
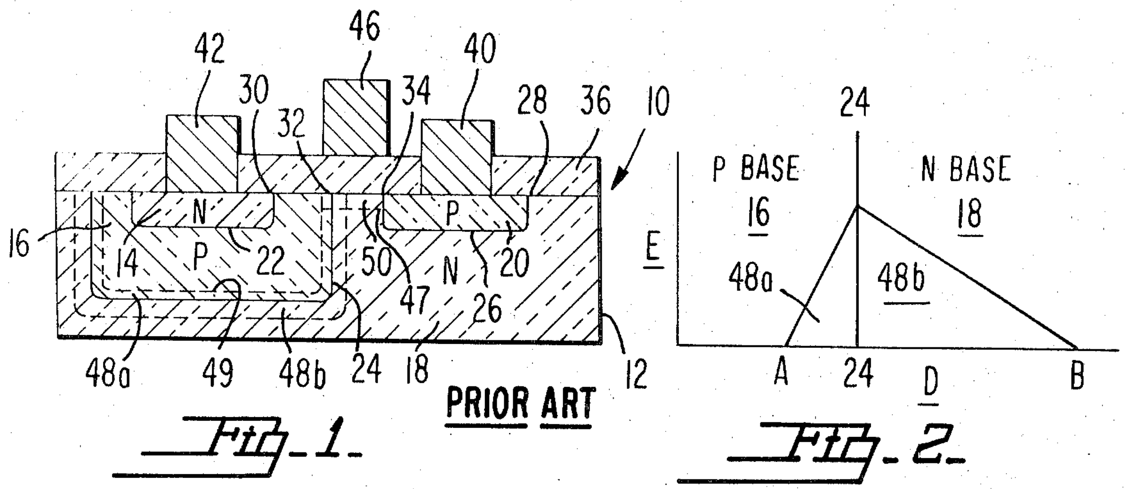
FIG. 1 is a cross-sectional view of a prior art thyristor.
FIG. 2 is a graph showing the electrostatic field within the thyristor shown in FIG. 1 with respect to distance from the blocking junction of the device in the forward direction, voltage blocking mode of operation.

The prior art device 10 shown in FIG. 1 comprises a body 12 of semiconductor material, e.g., silicon, having an N type emitter region 14, a P base region 16, an N base region 18, and a P emitter region 20. Where the various regions adjoin one another there are PN junctions 22, 24, and 26, each junction extending to a surface 28 of the body and having a surface-intercept 30, 32, and 34, respectively, therewith.

A layer 36 of a dielectric material, e.g., silicon dioxide, is disposed on the surface 28 of the body 12, and openings are provided through the layer 36 by means of which an anode electrode 40 makes direct ohmic contact with the P emitter 20, and a cathode electrode 42 makes direct ohmic contact with the N emitter 14.

Overlying the dielectric layer 36, and spaced from direct contact with the body 12 thereby, is a control electrode 46. The electrode 46 overlies a portion of the N base region 18 of the device and the two surface intercepts 32 and 34 of the PN junctions 24 and 26, respectively.

The device operates as follows.

In the forward direction voltage blocking, nonconducting state, a positive voltage is applied to the anode electrode 40 with the cathode electrode 42 and control electrode 46 at a reference potential, i.e., ground. With the conductivities of the various device regions as shown in FIG. 1, the voltage between the anode and cathode electrodes appears across the junction 24 between the P base 16 and the N base 18. That is, this junction 24, known as the "blocking" junction, is reverse biased, with a depletion layer **48*a*–48*b* (designated by the dash lines 49) extending into the two base regions 16 and 18 on either side of the junction 24, the portion of the depletion layer within the base region 16 being designated by the reference numeral 48*a*, and the portion thereof within the base region 18 being designated as 48*b*. The width of each depletion layer portion 48*a* and 48*b* is dependent directly on the amplitude of the anode to cathode voltage and inversely upon the conductivity of the base region in which the portion is disposed. In the embodiment shown, the base region 16 has a higher conductivity than that of the base region 18, whereby the width of the depletion layer portion 48*b* is greatr than that of the portion 48*a***.

To trigger the device 10 into conduction, a negative voltage of sufficient amplitude is applied to the control electrode 46 to invert or reverse the conductivity of a thin portion or channel 50 (a boundary of which is designated by the dash line 47 in FIG. 1) in the base 18 at the surface 27 of the body 12 directly beneath the electrode 46. The channel 50 extends from the P emitter 20 to the P base 16 and provides an ohmic path for holes from the P emitter 20 to the P base 16 which effectively short circuits the reverse biased, voltage blocking junction 24. Holes drift through the channel 50 (owing to the positive voltage on the anode electrode 40) and enter the P base 16. The holes accumulate in the P base 16 and thus forward bias the junction 22 between the P base 16 and the N emitter 14. Electrons are thus injected across the junction 22, diffuse across the P base 16, drift across the depletion layer **48*a*–48*b* associated with the junction 24, and accumulate in the N base 18 to forward bias the junction 26, whereupon additional holes are injected across the junction 26 into the N base 18. The holes diffuse across the N base 18, drift through the depletion layer 48*a*–48*b*, and accumulate in the P base 16 and thus forward bias the junction 22. At this point the condition process is self-sustaining even after removal of the triggering voltage from the electrode 46**.

A shortcoming of the device 10 shown in FIG. 1 is that it is severely limited with respect to the amplitude of the voltage that can be applied to the anode electrode. The reason for this is as follows.

FIG. 2 shows the variation of the electrostatic field (E) within the depletion layer 48a–48b (assuming a uniform but different conductivity within each base 16 and 18). As shown, the field is at a maximum at the junction 24 between the two bases 16 and 18, and decreases to zero at the edges A and B of the depletion layer 48a–48b. Since, as above noted, the depletion layer portion 48b is wider than the depletion layer 48a, owing to the relative resistivities thereof, the curve in FIG. 2 is steeper in the base 16 than in the base 18. Further, since the voltage drop through an electric field is equal to the integral of the field strength over the distance through the field, i.e., th area under the curve of FIG. 2, the voltage drop across the depletion layer portion 48a within the base 16 is less than the voltage drop across the depletion layer portion 48b within the base 18. Thus, for example, with a voltage of 400 volts between the anode and cathode electrodes and with a resistivity of the P base 16 of 15 ohm-cm and a resistivity of the N base 18 of 30 ohm-cm, the voltage drop across the depletion layer portion 48a within the P base 16 is about 50 volts, and the voltage drop across the depletion layer portion 48b within the N base 18 is about 350 volts.

Figure 3:
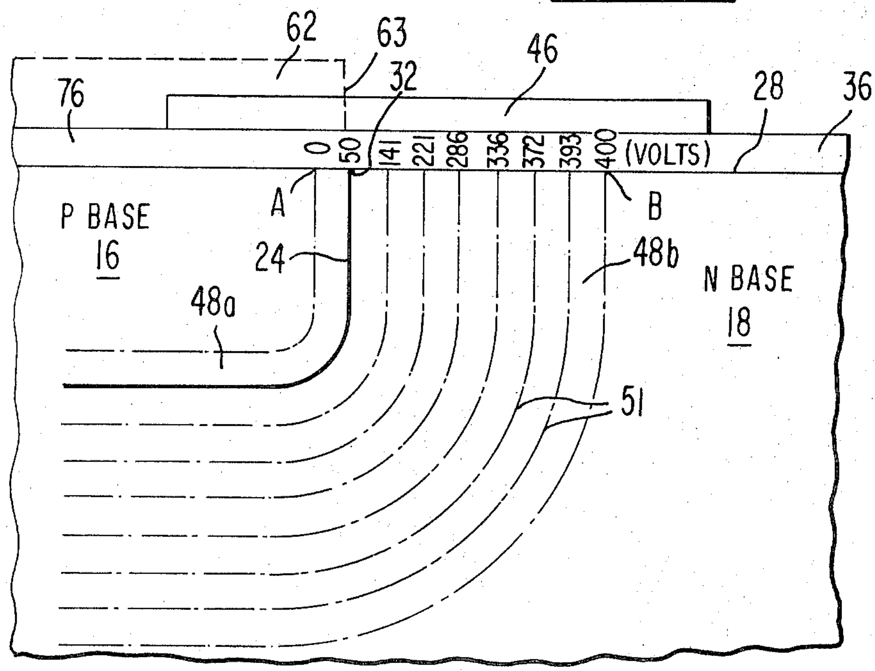
FIG. 3 schematically illustrates the potential distribution about a portion of the blocking junction of the FIG. 1 thyristor when in its forwad direction, voltage blocking mode of operation.

The potential distribution through the depletion layer 48a–48b in this example is illustrated in FIG. 3. In the figure, the equipotential lines within the depletion layer portions 48a and 48b are designated by dash-dot lines 51, and the potential, in volts, of each equipotential line is given.

Depending upon the voltage applied to the control electrode 46, potential differences exist across the dielectric layer 36 between the electrode 46 and points within the depletion layer 48a–48b when a voltage is applied between the anode and cathode electrodes.

Thus, for example, if the control electrode 46 is at or near ground potential, the maximum potential difference between the electrode 46 and the depletion layer, at the edge B of the depletion layer portion 48b, is about equal to the anode voltage, 400 volts in this example. Conversely, if the control electrode 46 is at the anode voltage of 400 volts, the potential difference, at the edge A of the depletion layer portion 48a, is still 400 volts. If the control electrode 46 is at some intermediate voltage, say 200 volts, the maximum potential stress applied across the layer 36 is 200 volts.

To prevent electrical breakdown of the dielectric layer 36 with a potential stress of 200 volts thereacross, and where the dielectric layer 36 is silicon dioxide, which typically has a breakdown strength of $10^7$ volts/cm., a thickness of the layer 36 in excess of 2000A is necessary. Such thickness is undesirably high with respect to the turn-on voltage sensitivity of the device. That is, the thicker the layer 36, the higher need be the voltage on the electrode 46 to turn on the device.

In accordance with the instant invention, the device turn-on sensitivity is significantly increased by disposing the device control electrode over less than the complete depletion layer associated with the blocking junction, and preferably only over portions of the depletion layer across which there is a relatively small potential difference. Then, by biasing the control electrode at or near a potential within the covered depletion layer portion, the maximum potential difference between the control electrode and any portion of the covered depletion layer is relatively small. This is accomplished as follows.

Figure 4:
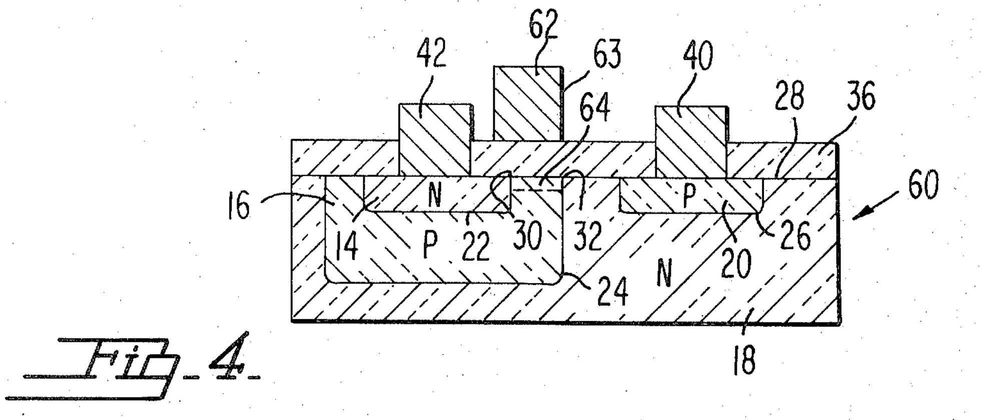
FIG. 4 is a cross-sectional view of a thyristor device in accordance with the instant invention.

As shown in FIG. 4, a device 60 in accordance with the instant invention is substantially identical to the device 10 shown in FIG. 1 with the exception that a control electrode 62 is disposed over the two junction surface intercepts 30 and 32, the edge 63 of the electrode 62 preferably being exactly aligned with the junction intercept 32.

Triggering of the device 60 into conduction is as follows. A positive voltage is applied to the electrode 62 of sufficient amplitude to give rise to a channel 64 of N conductivity extending across the P base 16 and ohmically connecting together the N emitter 14 and the N base 18. Since the voltage applied to the anode electrode 40 appears across the blocking junction 24, a voltage differential exists from end to end of the channel 64 to cause electrons from the N emitter 14 to drift through the channel 64 into the base 18 where they accumulate to forward bias the junction 26. Holes are thus injected across the junction 26 into the N base, diffuse across the N base 18 to the depletion layer associated with the junction 24 and are thereby injected into the P base 16. The holes accumulate in the P base 16 and forward bias the junction 22 to cause injection of electrons from the N emitter 14 into the P base 16, whereupon the charge flow process is self-sustaining upon removal of the triggering voltage from the electrode 62.

In this embodiment of the invention, the maximum potential stress applied across the layer 36 is significantly less than that applied across the layer 36 of the prior art device shown in FIG. 1. This is explained as follows.

With the same applied voltages and conductivities of the P base and the N base used in the above described example of a prior art device, the potential distribution through the depletion layer 48a–48b on opposite sides of the junction 24, in the forward direction voltage blocking mode of operation of the device 60, is the same as that for the device 10. Accordingly, in FIG. 3, the electrode 62 of the device 60 is shown in dashed lines superimposed over the electrode 46 of the device 10. The effect of having the electrode 62 spanning the P base 16 in the device 60 shown in FIG. 4, rather than spanning the N base 18 as in the device 10 shown in FIG. 1, is that the control electrode 62 is disposed only over that portion (48a) of the depletion layer 48a–48b having a relatively small potential difference thereacross (50 volts in this example). Thus, by operating the device 60 with the control electrode 62 at a potential at or near a potential within the depletion layer portion 48a, i.e., at a potential at or near the range of 0–50 volts in this example, the maximum potential stress across the dielectric layer 36 is quite small. For example, if the control electrode 62 is maintained at cathode potential (0 volts in this embodiment) and pulsed with positive voltages to turn on the device, the maximum potential stress to which the dielectric layer 36 is exposed, at the edge 63 of the electrode 62, is 50 volts. To sustain this voltage, the thickness of a silicon dioxide layer need only be greater than about 500A.

One problem associated with the device 60 shown in FIG. 4 is that the location of the edge 63 of the electrode 62 with respect to the junction intercept 32 is relatively critical. That is, while the electrode edge 63 must be close enough to the junction 24 to give rise to a channel 64 which adequately spans the P base 16 for ohmically connecting the emitter 14 with the N base 18, the electrode 62 preferably should not extend significantly beyond the junction intercept 32 and over the depletion layer portion 48*b*. Such overlap over the portion 48*b* increases the potential variation along the length of the depletion layer covered by the electrode 62, and thus increases the potential stress applied across the dielectric layer 36. Moreover, since the potential gradient along the depletion layer portion 48*b* rather high (with the parameters of the instant described embodiment) e.g., in the order of 350 volts per mil, relatively small variations in the location of the electrode edge 63 relative to the junction intercept 32 result in relatively large variations in the electrical stress on the dielectric layer 36.

Figure 5:
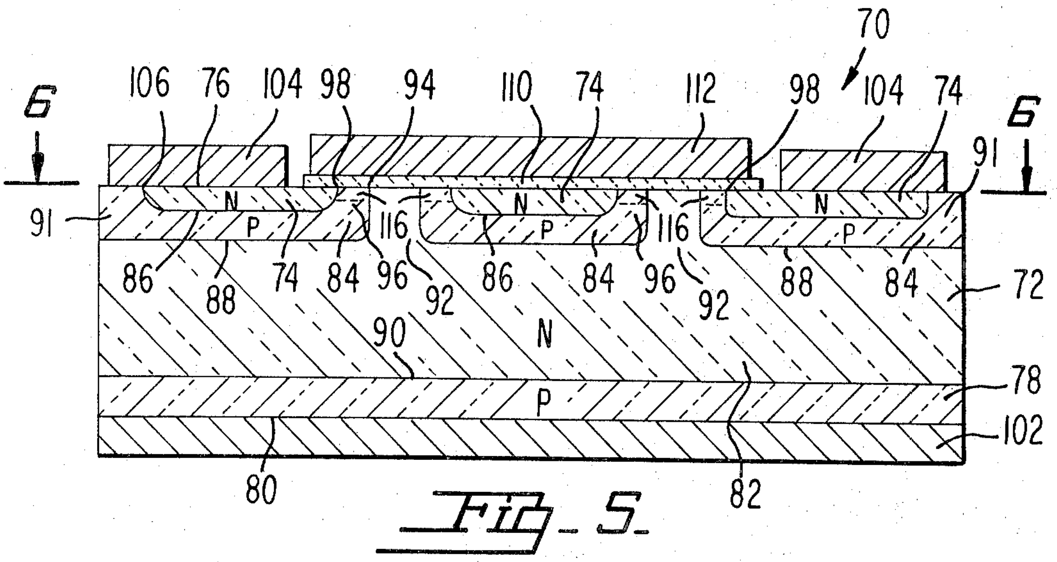
FIG. 5 is a cross-sectional view of another thyristor device in accordance with this invention.
Figure 6:
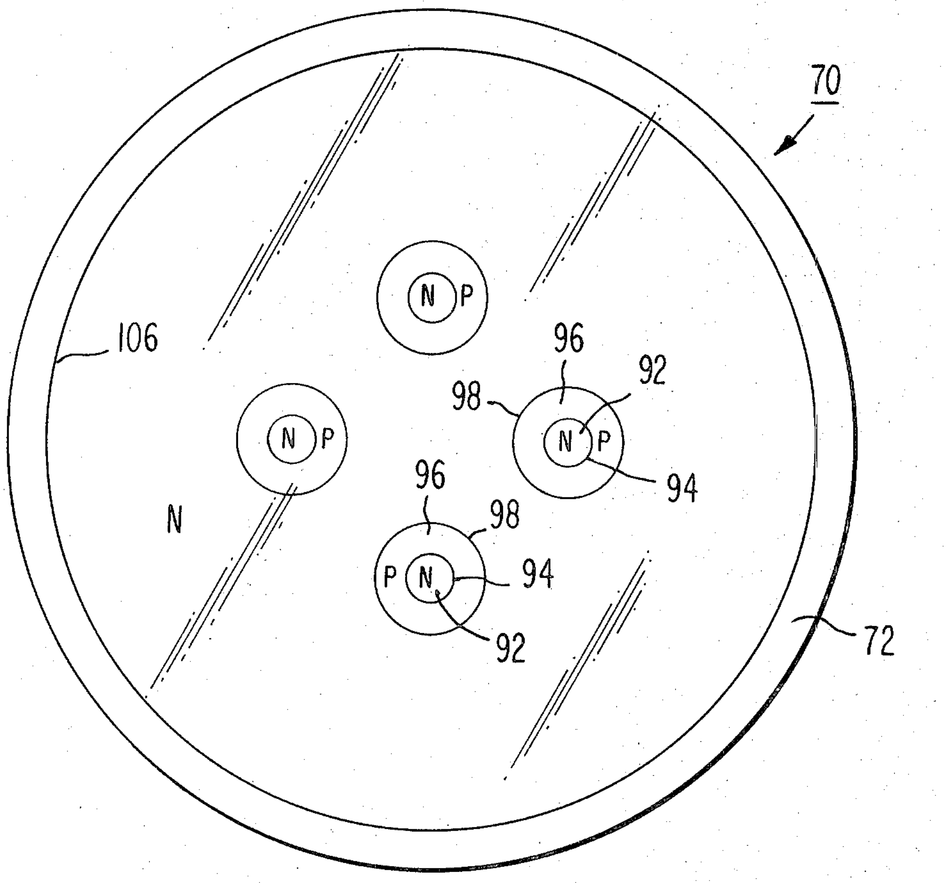
FIG. 6 is a cross-sectional view taken along the line 6—6 of FIG. 5.

To avoid the need for critical alignment of the control electrode, a structure such as that illustrated in FIGS. 5 and 6 can be used. In these figures, a device 70 is shown comprising a disc-like body 72 of semiconductor material, e.g., silicon, having an N emitter 74 at one surface 76 of the body, a P emitter 78 at another surface 80, and an N base 82 and a P base 84 disposed between the two emitters 74 and 78. Where the various different conductivity type regions adjoin one another, there are PN junctions 86, 88, and 90.

Each of the P emitter 78, the N base 82 and the P base 84 comprise generally flat layers extending across the body 72. The emitter 74 also comprises a generally flat layer, but does not extend across the full extent of the body 72; a peripheral portion 91 of the P base 84 extending upwardly around the N emitter 74 to the body surface 76.

The two base regions 82 and 84 each include a number of extensions thereof which project upwardly through the emitter layer 74 to the body surface 76. Thus, the N base 82 includes a number of circular cylindrical extensions 92 which project through the base 84 and the N emitter 74 layers and form circular junction surface intercepts 94 with the body surface 76 (see FIG. 6). Also, the base 84 includes a number of annular extensions 96 each of which surrounds a different one of the N base extensions 92, and which extend through the N emitter layer 74 and form additional circular junction surface intercepts 98 surrounding intercepts 94.

Of importance, as described hereinafter, is that the N base 82 is of a higher resistivity than the P base 84. For example, the N base 82 can have a resistivity of 50 ohm-cm and the P base 84 a resistivity of 1 ohm-cm, both bases, in this embodiment, being of uniform resistivity.

Disposed on the lower surface 80 of the body 72 in direct ohmic contact with the P emitter 78 is an anode electrode 102. An annular cathode electrode 104 is disposed on the upper surface 76 in direct ohmic contact with both the N emitter 74 and the peripheral portion 91 of the P base 84 at the surface 76, the electrode 104 thus overlapping and shorting a surface intercept 106 of the junction 86 between the N emitter 74 and the P base 84. Such "shorted emitter" structures in thyristor type devices are known.

Covering a central portion of the surface 76 is a layer 110 of a dielectric material, e.g., silicon dioxide. A control electrode 112 is disposed on the layer 110 out of direct contact with the surface 76 and in such position to overlie the various surface intercepts 94 and 98 of the two junctions 88 and 86, respectively.

In the forward direction voltage blocking mode of operation of the device, i.e., with a voltage on the anode electrode 102 positive relative to the cathode electrode 104 and the device 70 in its non-conductive state, the "blocking" junction of the device is the junction 88 between the N base 82 and the P base 84.

To trigger the device 70 into conduction, a positive voltage is applied to the control electrode 112 of sufficient amplitude to induce annular channels 116 of N conductivity at the surface 76 of the body 72. The channels 116 extend across the upper portions of the annular extensions 96 of the P base 84 and provide ohmic paths for electrons from the N emitter 74 through the annular extensions 96 to the N base 82. As described above in connection with the operation of the device 60 shown in FIG. 4, by ohmically connecting together the device N emitter and N base, the device can be triggered into its conducting state.

Aside from the requirement that the electrode 112 overlies the various junction surface intercepts 94 and 98, the location of the electrode 112 with respect to these junction intercepts is not critical. The reason for this is as follows.

Figure 7:
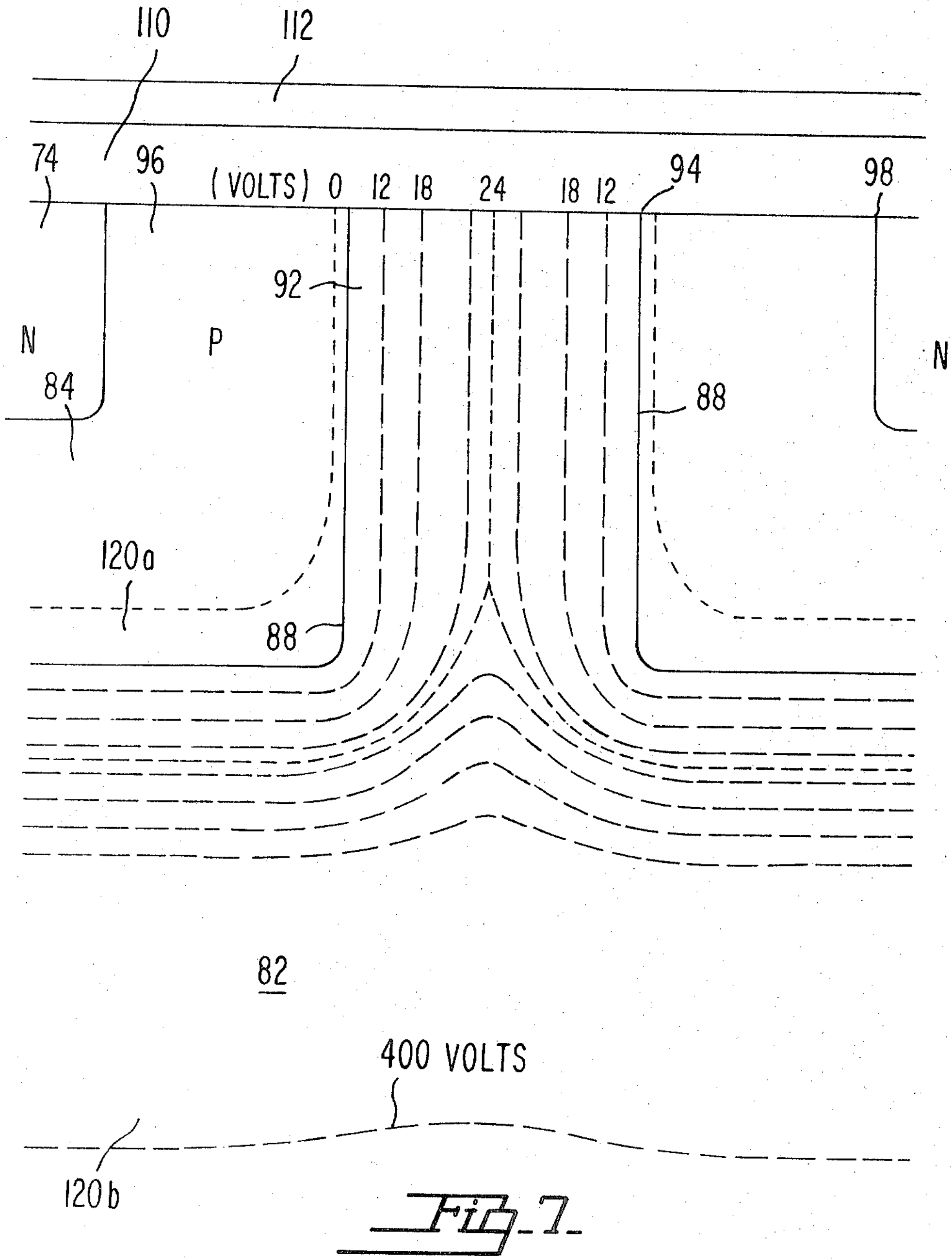
FIG. 7 is similar to FIG. 3 but applicable to the thyristor shown in FIG. 5.

In the forward direction voltage blocking mode of operation, with, e.g., 400 volts on the anode electrode 102, and the cathode electrode 104 at zero potential, the potential distribution within the depletion layer 120*a*–120*b* associated with the blocking junction 88 is as shown in FIG. 7. Since the conductivity of the N base 82 is less than that of the P base 84, as previously noted, the width of the portion 120*b* of the depletion layer within the N base 82 is greater than that of the portion 120*a* within the P base 84. In order to avoid electrical breakdown of the device, each layer 82 and 84 is of sufficient width so that the depletion layer portion therein, at the rated blocking voltage of the device, does not extend entirely across the layer and into contact with the adjoining emitter. This is standard design practice with devices of this type.

Within the cylindrical extensions 92 of the N base 82, however, the depletion layer portion 120*b* extends entirely thereacross. This occurs (desirably, as hereinafter explained) provided the number of bound charges per unit area within the extensions 92, i.e., the charge associated with the impurity atoms within the extensions 92, is insufficient to support the entire potential applied across the blocking junction 88.

The significance of this is that, regardless of the voltage applied between the anode and cathode electrodes and thus appearing across the depletion layer 120*a*–120*b*, the maximum voltage appearing across each of the extensions 92 is limited by the amount and concentration of fixed charge within the extensions. By proper selection of the doping and dimensions of the extensions 92, the total voltage applied across the extensions 92 can be limited to only a small fraction of the total voltage applied between the cathode and anode electrodes of the device. Thus, in comparison with the device 60 shown in FIG. 4, wherein the location of the edge 63 of the control electrode 62 with respect to the depletion layer portion within the base region of lower conductivity is critical, in the instant embodiment, no such criticality exists. That is, since only a portion of the depletion layer within the base region of low conductivity extends to the surface of the semiconductor body, such portion supporting only a small part of the voltage applied across the device, the control electrode 112 is exposed to only a small part of the potential appearing across the full extent of the depletion layer portion 120*b*. The portion 120*a* of the depletion layer within the base 84 of higher conductivity, fully covered by the control electrode 112, gives rise to little potential stress across the dielectric layer 110 owing to the small potential drop across the portion 120*a*. The low voltage drop across the depletion layer portion 120*a* results, as previously explained, from the relative conductivities of the two base regions 82 and 84.

While, as explained, it is preferably that the two base regions of the inventive devices be of different conductivities, with the control electrode being disposed over the base region of higher conductivity, the two base regions can be of the same conductivity. By disposing the control electrode so as to overlie none of the depletion layer portion in one of the base regions (e.g., as in the device 60 shown in FIG. 4 with the edge 63 of the control electrode 62 disposed in exact alignment with the junction intercept 32), or to overlie only a small portion thereof (as in the device 70 shown in FIG. 5), improvements over the prior art devices in triggering sensitivity are achieved even where the two bases are of the same conductivity.

With the above description in mind, persons skilled in the semiconductor art will have no difficulty designing operable devices in accordance with the instant invention. Thus, for example, the basic SCR device can be designed in accordance with known design parameters. The amount of current required to trigger such SCR devices into conduction is the same whether the triggering current is injected into a base region of the device via an electrode in direct ohmic contact with the base region, or is injected into the base region via a channel across the other base region. The selection of the device parameters to give rise to a channel of sufficient conductivity for the triggering current required at a given anode-to-cathode voltage is in accordance with known semiconductor field effect device design principles. Likewise, extensions 92 of the base 82, which are in series with the channels 116 with respect to the triggering current, should be of adequately high conductivity so that the necessary triggering current can be obtained at the rated turn-on anode-to-cathode voltage of the device.

By way of example, various design parameters for a device of the type shown in FIGS. 5 and 6 are given. The device has a blocking capability of 1200 volts, a current rating of 40 amperes, and can be triggered into its conductive state by a control electrode signal of about 15 volts when the anode to cathode voltage is 20 volts or more. Also, the device has a turn-on time of approximately 2 microseconds. The body has an area of 0.2 square cm, and a thickness of 10 mils. The N emitter 74 is a diffused region having a surface concentration of approximately $10^{20}$ atoms per cc and is 2 mils thick, and the P emitter 78 has a surface concentration of approximately $10^{20}$ atoms per cc and is 2 mils thick. The N base 82 (including the extensions 92 thereof) is of a uniform resistivity of 50 ohm cm, the extensions 92 being circular cylinders of 2 mils diameter and 3 mils length, and the N base 82 having a thickness of 5 mils. The P base 84 has a thickness of 1 mil, and a uniform resistivity of 5 ohm cm; and P base annular extensions 96 having a thickness of 1 mil, i.e., an inner diameter of 2 mils and an outer diameter of 4 mils. The dielectric layer 110 has a thickness of 1000 Å. Each base extension 92 has a total resistance of about 19,000 ohms, and to provide the necessary triggering current (of abut 10 milliamps) with an anode-to-cathode voltage of 20 volts, 20 extensions 92 are provided. The voltage drop along each extension 92 is thus about 10 volts, and the voltage drop along each channel 116 is about 10 volts.

In a device of the type shown in FIGS. 5 and 6, containing regions 82 and 84 each of uniform conductivity, one method of fabrication involves epitaxially depositing a uniform layer of N type conductivity material on a substrate of P type material, etching away part of the N type material to form the N base 82 having upwardly extending projections 92, and epitaxially depositing a layer of P type material on the N type material and around the extensions 92 to form the P base 84.

Devices according to the instant invention can also be made with non-uniform base region conductivities, and can be fabricated in accordance with known diffusion processes. Also, other device geometries can be used, especially for the N base extensions 92 which can be of other than circular cross-section.

What is claimed is:

1. A semiconductor controlled rectifier comprising:

a body of semiconductor material, regions of opposite type conductivity within said body forming two emitter regions and two base regions, each of said base regions being disposed between one emitter region and the other of said base regions, and one of said base regions forming, with an adjoining region, a PN junction which is reverse biased in the forward direction, voltage blocking mode of operation of said rectifier, a control electrode overlying one of said base regions for inducing a channel therein of a conductivity type opposite to that of said one base region for ohmically connecting together regions separated by said one base region, said control electrode being disposed relative to said reverse biased junction to overlie:

a. the entire width of the depletion layer in the region on one side of said reverse biased junction; and b. only a small part of the width of the depletion layer in the region on the other side of said reverse biased junction; and wherein the conductivity of the region on said one side of said junction is greater than the conductivity in the region on said other side of said junction.

2. A semiconductor controlled rectifier comprising:

a body of semiconductor material, regions of opposite type conductivity within said body forming two emitter regions and two base regions, each of said base regions being disposed between one emitter region and the other of said base regions, and one of said base regions forming, with an adjoining region, a PN junction which is reverse biased in the forward direction, voltage blocking mode of operation of said rectifier, a control electrode overlying one of said base regions for inducing a channel therein of a conductivity type opposite to that of said one base region for ohmically connecting together regions separated by said one base region, the conductivity of said one base region being greater than that of the other of said base regions.

3. A semiconductor device comprising:

a body of semiconductor material having a pair of opposed surfaces, an emitter region disposed within said body at each of said surfaces, and two base regions disposed between said emitter regions, each base region adjoining a different one of said emitter regions and separating the other base region from said adjoining emitter region, one of said base regions having a projection extending through the other of said base regions and through the emitter region adjacent said other base region to a surface of said body, said other base region having a projection extending to said surface and being disposed between said one base region projection and said adjoining emitter region, a control electrode capacitively coupled to said other base projection for inducing therein a channel of a conductivity type opposite of that of said other base for ohmically connected together said adjoining emitter region and said projection of said one base region, the width of the depletion layer in said one base region when said device is in its forward direction voltage blocking mode of operation being greater than the width of said depletion layer within the projection of said one base region.

4. A device as in claim 3, in which the conductivity of said other base region is greater than that of said one base region.

* * * * *